United States Patent
Tanaka et al.

(10) Patent No.: US 7,381,901 B2
(45) Date of Patent: Jun. 3, 2008

(54) HINGE BOARD AND METHOD FOR PRODUCING THE SAME

(75) Inventors: Takashi Tanaka, Chiba (JP); Hidenori Nakajima, Chiba (JP); Yuichi Tokuda, Chiba (JP)

(73) Assignee: Nippon Steel Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/252,626

(22) Filed: Oct. 19, 2005

(65) Prior Publication Data

US 2007/0062722 A1    Mar. 22, 2007

(30) Foreign Application Priority Data

Aug. 26, 2005    (JP) .............................. 2005-246448

(51) Int. Cl.
*H05K 1/00*    (2006.01)
(52) U.S. Cl. ...................... 174/254; 174/255
(58) Field of Classification Search ................ 174/254, 174/255
See application file for complete search history.

(56) References Cited

U.S. PATENT DOCUMENTS

| | | | | |
|---|---|---|---|---|
| 5,516,989 A | * | 5/1996 | Uedo et al. ................. | 174/254 |
| 5,759,047 A | * | 6/1998 | Brodsky et al. ............... | 439/66 |
| 5,939,789 A | * | 8/1999 | Kawai et al. ................ | 257/758 |
| 5,997,983 A | * | 12/1999 | Caron et al. ................. | 428/105 |
| 6,350,387 B2 | * | 2/2002 | Caron et al. ................. | 430/314 |
| 6,384,339 B1 | * | 5/2002 | Neuman ..................... | 174/254 |
| 6,586,081 B1 | * | 7/2003 | Nishinaka et al. ........... | 428/209 |
| 6,699,572 B2 | * | 3/2004 | Yamamoto et al. ......... | 428/216 |
| 6,921,869 B2 | * | 7/2005 | Terunuma et al. ........... | 174/256 |

FOREIGN PATENT DOCUMENTS

JP    7-312469    11/1995

\* cited by examiner

*Primary Examiner*—Ishwar (I. B.) Patel
(74) *Attorney, Agent, or Firm*—Cheng Law Group PLLC (57) ABSTRACT

A hinge board having a hinge bending part and a rigid part includes: not less than two flexible wiring boards including a polyimide sheet layer, a conductor layer having a circuit formed on both sides or one side of the polyimide sheet layer, and a coverlay film layer covering the conductor layer; and a bonding material for bonding the flexible wiring boards. At least one of the flexible wiring boards is a flexible double-sided wiring board including the conductor layers on both sides of the polyimide sheet layer. Moreover, the flexible wiring boards are bonded to each other in the rigid part by use of the bonding material in such a manner that a space part is formed between the flexible wiring boards in the hinge bending part.

7 Claims, 4 Drawing Sheets

HINGE BOARD AND METHOD FOR PRODUCING THE SAME

BACKGROUND OF THE INVENTION

1. Field of the Invention

The present invention relates to a hinge board useful as a board for an electronic device such as a folding portable telephone, and a method for producing the hinge board.

2. Related Background Art

In recent years, an increase in a memory capacity of an electronic device has advanced wiring miniaturization, high-density wiring and high-speed electronic signals. Accordingly, a demand level of mechanical properties for a wiring board has been set higher. Moreover, for a hinge board having a hinge bending part, which is used for a folding portable telephone, miniaturization of wiring and the like are similarly demanded. Thus, the hinge board has been required to have a multilayer structure and to have its thickness reduced. However, a conventional multilayer hinge board has a problem that, when a hinge bending part is repeatedly bent, there occurs disconnection in a conductor circuit. Thus, one having sufficient hinge flexibility in a hinge part of the folding portable telephone has not necessarily been obtained.

Therefore, for example, Japanese Patent Application Laid-Open Gazette No. Hei 7-312469 (JP 7-312469 A) has disclosed a structure of a bending part of a multilayer flexible circuit board which is formed in the following manner. Specifically, in the multilayer flexible circuit board, at least one layer of a flexible insulating base material is bonded, by use of an adhesive layer, between a plurality of wiring conductors in which a required wiring pattern is formed by use of a conductive foil. Moreover, in the multilayer flexible circuit board, a non-bonded part is provided so that the flexible insulating base material in the bending part of the multilayer flexible circuit board is not bonded to the wiring conductor or another flexible insulating base material at least on one side. In the specification, it is described that the multilayer flexible circuit board is formed by laminating adhesive-free one-side copper-clad plates.

However, in the multilayer flexible circuit board described in Document 1, an adhesive layer is required to laminate each of the one-side copper-clad plates. Thus, in the case where the circuit board is formed to have a multilayer structure, a thickness thereof is increased and sufficient high-density wiring cannot be achieved. In the above point, the multilayer flexible circuit board described above is not satisfactory yet.

SUMMARY OF THE INVENTION

The present invention was made in consideration of the problems of the conventional technology described above. It is an object of the present invention to provide a hinge board and a method for producing the same, the hinge board being capable of realizing reduction in thickness thereof and high-density wiring as well as sufficiently preventing disconnection in a conductor circuit when a hinge bending part is repeatedly bent.

As a result of keen study to achieve the foregoing object, the inventors of the present invention have found out the following. Specifically, by bonding two or more of specific flexible wiring boards including a flexible double-sided wiring board in a rigid part by use of a bonding material in such a manner that a space part is formed between the flexible wiring boards in a hinge bending part, it is possible to obtain a hinge board which can realize reduction in thickness thereof and high-density wiring as well as sufficiently prevent disconnection in a conductor circuit when the hinge bending part is repeatedly bent.

Specifically, a hinge board of the present invention is a hinge board having a hinge bending part and a rigid part. The hinge board includes: not less than two flexible wiring boards including a polyimide sheet layer, a conductor layer having a circuit formed on both sides or one side of the polyimide sheet layer, and a coverlay film layer covering the conductor layer; and a bonding material for bonding the flexible wiring boards. At least one of the flexible wiring boards is a flexible double-sided wiring board including the conductor layers on both sides of the polyimide sheet layer. Moreover, the flexible wiring boards are bonded to each other in the rigid part by use of the bonding material in such a manner that a space part is formed between the flexible wiring boards in the hinge bending part.

Moreover, in the hinge board of the present invention, it is preferable that at least two of the flexible wiring boards should be the flexible double-sided wiring boards.

Furthermore, the hinge board of the present invention further includes a flexible single-sided wiring board, which includes a conductor layer only on one side of a polyimide sheet layer, on an uppermost surface and/or a lowermost surface of the hinge board. Moreover, it is preferable that the conductor layer of the flexible single-sided wiring board should be formed on an upper surface side of the flexible single-sided wiring board on the uppermost surface and/or on a lower surface side of the flexible single-sided wiring board on the lowermost surface.

Moreover, in the hinge board of the present invention, it is preferable that the polyimide sheet layer should be formed of a plurality of polyimide-based resin layers.

A method for producing a hinge board of the present invention is a method for producing a hinge board including a hinge bending part and a rigid part. The method includes the steps of: etching not less than two polyimide boards, each of which is formed by laminating conductor films on both sides or one side of a polyimide sheet, and obtaining not less than two laminated bodies in each of which conductor layers are laminated, the conductor layers having circuits formed on both sides or one side of a polyimide sheet layer; obtaining not less than two flexible wiring boards by attaching coverlay films to surfaces on which the conductor layers of the laminated bodies are laminated, respectively; and obtaining the hinge board by bonding the flexible wiring boards by use of a bonding material. In the method, at least one of the flexible wiring boards is a flexible double-sided wiring board including the conductor layers on both sides of the polyimide sheet layer. Moreover, the flexible wiring boards are bonded to each other in the rigid part by use of the bonding material in such a manner that a space part is formed between the flexible wiring boards in the hinge bending part.

Moreover, in the method for producing a hinge board of the present invention, it is preferable that at least two of the flexible wiring boards should be the flexible double-sided wiring boards.

Furthermore, in the method for producing a hinge board of the present invention, it is preferable that the hinge board should further include a flexible single-sided wiring board, which includes a conductor layer only on one side of a polyimide sheet layer, on an uppermost surface and/or a lowermost surface of the hinge board. Moreover it is preferable that the method should further include the steps of: further bonding a polyimide single-sided board, in which a conductor film is laminated only on one side of a polyimide sheet, to the uppermost surface and/or the lowermost surface of the hinge board by use of a bonding material in such a manner that the conductor film of the polyimide single-sided board is positioned on the outer side; and forming a circuit on a surface of the polyimide single-sided board by etching the polyimide single-sided board, and, thereafter, obtaining the hinge board by attaching a coverlay film to the side on which the conductor layer of the polyimide single-sided board is laminated.

Moreover, in the method for producing a hinge board of the present invention, it is preferable that the polyimide sheet layer should be formed of a plurality of polyimide-based resin layers.

According to the present invention, it is possible to provide a hinge board and a method for producing the same, the hinge board being capable of realizing reduction in thickness thereof and high-density wiring as well as sufficiently preventing disconnection in a conductor circuit when a hinge bending part is repeatedly bent.

DETAILED DESCRIPTION OF THE PREFERRED EMBODIMENTS

The present invention will be described in detail below with reference to an embodiment.

First, a hinge board of the present invention will be described. Specifically, the hinge board of the present invention is a hinge board having a hinge bending part and a rigid part. The hinge board includes: not less than two flexible wiring boards including a polyimide sheet layer, a conductor layer having a circuit formed on both sides or one side of the polyimide sheet layer, and a coverlay film layer covering the conductor layer; and a bonding material for bonding the flexible wiring boards. At least one of the flexible wiring boards is a flexible double-sided wiring board including the conductor layers on both sides of the polyimide sheet layer. Moreover, the flexible wiring boards are bonded to each other in the rigid part by use of the bonding material in such a manner that a space part is formed between the flexible wiring boards in the hinge bending part.

The polyimide sheet layer according to the present invention may be one formed of a single polyimide-based resin layer or one formed of a plurality of polyimide-based resin layers. Although not particularly limited, it is preferable that the polyimide sheet layer of the present invention should be the one formed of a plurality of polyimide-based resin layers from the viewpoint of adhesion between the polyimide sheet layer and a conductor layer to be described later. As such a polyimide-based resin, for example, heat-resistant resin such as polyimide, polyamide-imide, polybenzimidazole and polyimide-ester can be used. Moreover, in the case where the one formed of a plurality of polyimide resin layers is used as the polyimide sheet layer, it is preferable to use polyimide-based resins made of a high thermal expansion resin and a low thermal expansion resin which have different linear expansion coefficients from each other. Note that, as to such a high thermal expansion resin and a low thermal expansion resin, a resin having a linear expansion coefficient higher than a simple average of a linear expansion coefficient of the polyimide sheet layer is referred to as the high thermal expansion resin. Moreover, a resin having a linear expansion coefficient lower than the simple average thereof is referred to as the low thermal expansion resin.

Moreover, the linear expansion coefficient of the high thermal expansion resin as described above is preferably $25 \times 10^{-6}$ (1/K) or more, more preferably $30 \times 10^{-6}$ to $100 \times 10^{-6}$ (1/K). Furthermore, the linear expansion coefficient of the low thermal expansion resin as described above is preferably less than $25 \times 10^{-6}$ (1/K), more preferably 0 to $20 \times 10^{-6}$ (1/K). Moreover, a difference in the linear expansion coefficient between the high thermal expansion resin and the low thermal expansion resin is preferably $5 \times 10^{-6}$ (1/K) or more, more preferably $10 \times 10^{-6}$ (1/K) or more.

Furthermore, as the polyimide sheet layer, from the viewpoint of adhesion between the polyimide sheet layer and the conductor layer to be described later, it is preferable to use a laminated body including a high thermal expansion resin layer which comes into contact with the conductor layer to be described later and a low thermal expansion resin layer which comes into contact with such a high thermal expansion resin layer. Moreover, as a ratio (B/A) of a thickness (A) of the high thermal expansion resin layer to a thickness (B) of the low thermal expansion resin layer, the ratio (B/A) of the thickness is preferably a value within a range of 0.1 to 200, more preferably, a value within a range of 2 to 100, still more preferably, a value within a range of 3 to 25. If the ratio (B/A) of the thickness is less than the lower limit, the board tends to be easily curled. On the other hand, if the ratio exceeds the upper limit, there is a tendency that an effect of improving the adhesion between the polyimide sheet layer and the conductor layer to be described later cannot be sufficiently obtained.

Moreover, although not particularly limited, a thickness of the polyimide sheet layer is preferably within a range of 5 to 50 μm, more preferably within a range of 10 to 30 μm. If the thickness of the polyimide sheet layer is less than 5 μm, electrical characteristics such as insulation properties tend to be lowered and strength of the board tends to be lowered. On the other hand, if the thickness of the polyimide sheet layer exceeds 50 μm, flexibility of the hinge board obtained tends to be lowered and reduction in thickness of the board tends to be difficult.

The conductor layer according to the present invention is a layer formed by forming a circuit in a conductor film laminated on both sides or one side of the polyimide sheet layer. As such a conductor film, although not particularly limited, for example, a rolled copper foil, an electrolytic copper foil and a copper foil separated out by sputtering the polyimide sheet layer are cited.

Moreover, although not particularly limited, a thickness of the conductor layer is preferably 5 to 30 μm, more preferably 7 to 20 μm. If the thickness of the conductor layer is less than the lower limit, disconnection tends to occur in the circuit due to lowered strength of a conductor circuit formed. On the other hand, if the thickness thereof exceeds the upper limit, the board also tends to lack in practicality due to lowered flexing characteristics.

The coverlay film layer according to the present invention may be a layer covering the conductor layer. Although not particularly limited, for example, a layer formed of any of the following films can be used, including a coverlay film in which an adhesive layer made of epoxy-based or acrylic-based resin is provided on one surface of a polyimide film, a coverlay film made of epoxy, a coverlay film made of polyester-based resin, a coverlay film made of a liquid crystal polymer, a coverlay film made of polyimide-based resin, and the like. Among the coverlay films described above, from the viewpoint of the ability to further improve heat resistance, the coverlay film in which the adhesive layer made of epoxy-based or acrylic-based resin is provided on one surface of the polyimide film, the coverlay film made of the liquid crystal polymer and the polyimide coverlay film are preferable. Moreover, from the viewpoint of easiness to control a film thickness, the coverlay film made of polyimide-based resin is more preferable. Such a coverlay film may be one formed of only a single layer or one formed of a plurality of layers.

Moreover, although not particularly limited, a thickness of the coverlay film as described above is preferably 5 to 50 μm, more preferably 10 to 30 μm. If the thickness of the coverlay film is less than the lower limit, it tends to be difficult to give sufficient hinge flexibility to the hinge board obtained. Moreover, it tends to be difficult to handle the film because the film is easily cut. On the other hand, if the thickness thereof exceeds the upper limit, due to a reduced bend radius of the conductor circuit in the hinge board obtained, disconnection is likely to occur in the conductor circuit and reduction in thickness of the hinge board tends to be difficult. Moreover, it tends to be difficult to handle the film because the film is too hard.

As the coverlay film as described above, a commercially-available coverlay film may be used. Although not particularly limited, for example, CVA0525KA (manufactured by Arisawa Mfg. Co., Ltd.), CVA0515KA (manufactured by Arisawa Mfg. Co., Ltd.), CISV1225 (manufactured by Nikkan Industries Co., Ltd.) and CA231 (manufactured by Shin-Etsu Chemical Co., Ltd.) can be used.

The flexible wiring board according to the present invention includes the polyimide sheet layer described above, the conductor layer described above and the coverlay film layer described above. Moreover, such a flexible wiring board may be a flexible double-sided wiring board including the conductor layers on both sides of the polyimide sheet layer or may be a flexible single-sided wiring board including the conductor layer only on one side of the polyimide sheet layer.

The bonding material according to the present invention may be one which can bond the flexible wiring boards. Although not particularly limited, for example, an adhesive film for a wiring board, which is formed of the following composition, can be used. Specifically, the composition includes polyimide-based resin/epoxy-based resin, acrylonitrile-butadiene rubber/phenol resin, phenol resin/butyral resin, acrylonitrile-butadiene rubber/epoxy resin, and the like. Among the adhesive films described above, from the viewpoint of heat resistance, processability and the like, it is preferable to use the adhesive film formed of the composition of polyimide resin/epoxy resin.

Moreover, although not particularly limited, a thickness of the bonding material as described above is preferably within a range of 10 to 100 μm, more preferably within a range of 20 to 50 μm. If the thickness of the bonding material as described above is less than the lower limit, manufacturing of a bonding sheet itself and handling in lamination tend to be difficult. On the other hand, if the thickness thereof exceeds the upper limit, reduction in thickness of the hinge board tends to be difficult.

As the bonding material as described above, a commercially-available adhesive film or sheet may be used. Although not particularly limited, for example, SAFD25 (manufactured by Nikkan Industries Co., Ltd.) and Pyralux LF0100 (manufactured by DuPont Corp.) can be used.

In the hinge board of the present invention, at least one of the flexible wiring boards included in the hinge board of the present invention is required to be the flexible double-sided wiring board. If none of the flexible wiring boards is the flexible double-sided wiring board, the thickness of the hinge board is increased. Thus, sufficient high-density wiring cannot be achieved. Furthermore, in the hinge board of the present invention, from the viewpoint of achieving further reduction in thickness of the board and higher density wiring, it is preferable that at least two of the flexible wiring boards included in the hinge board of the present invention should be the flexible double-sided wiring boards. It is more preferable that all the flexible wiring boards included in the hinge board of the present invention, except for those on the uppermost and lowermost surface sides, are the flexible double-sided wiring boards.

Moreover, in the hinge board of the present invention, it is required that the flexible wiring boards are bonded to each other in the rigid part by use of the bonding material in such a manner that a space part is formed between the flexible wiring boards in the hinge bending part. If there is no space part formed between the flexible wiring boards in the hinge bending part, disconnection occurs in the conductor circuit when the hinge bending part is repeatedly bent.

Furthermore, the hinge board of the present invention further includes a flexible single-sided wiring board, which includes a conductor layer only on one side of a polyimide sheet layer, on the uppermost surface and/or the lowermost surface of the hinge board. Moreover, it is preferable that the conductor layer of the flexible single-sided wiring board should be formed on an upper surface side of the flexible single-sided wiring board on the uppermost surface and/or on a lower surface side of the flexible single-sided wiring board on the lowermost surface. By setting the hinge board to have the configuration as described above, it tends to be easy to realize arbitrary conduction between a plurality of circuits laminated by use of through-holes and the like in a method for producing a hinge board according to the present invention, which will be described later.

Next, description will be given of a method for producing a hinge board according to the present invention. Specifically, the method for producing a hinge board according to the present invention is a method for producing a hinge board which includes a hinge bending part and a rigid part. The method includes the steps of: etching not less than two polyimide boards, each of which is formed by laminating conductor films on both sides or one side of a polyimide sheet, and obtaining not less than two laminated bodies in each of which conductor layers are laminated, the conductor layers having circuits formed on both sides or one side of a polyimide sheet layer; obtaining not less than two flexible wiring boards by attaching coverlay films to surfaces on which the conductor layers of the laminated bodies are laminated, respectively; and obtaining the hinge board by bonding the flexible wiring boards by use of a bonding material. In the method, at least one of the flexible wiring boards is a flexible double-sided wiring board including the conductor layers on both sides of the polyimide sheet layer. Moreover, the flexible wiring boards are bonded to each other in the rigid part by use of the bonding material in such a manner that a space part is formed between the flexible wiring boards in the hinge bending part.

First, description will be given of the step of etching not less than two polyimide boards, each of which is formed by laminating conductor films on both sides or one side of a polyimide sheet, and obtaining not less than two laminated bodies in each of which conductor layers are laminated, the conductor layers having circuits formed on both sides or one side of a polyimide sheet layer (the step of forming circuits in the flexible wiring board).

Here, the polyimide sheet forms the polyimide sheet layer described above. In addition, as such a polyimide sheet, the same as that of the polyimide sheet layer described above can be used. Moreover, as the conductor film, the same as that described above can be used.

Moreover, as a method for producing the polyimide board as described above, although not particularly limited, the following methods can be used, for example, including: a method for laminating the polyimide sheet on the conductor film by applying a polyimide precursor resin onto the conductor film; a method for attaching the conductor film to the polyimide sheet; and a method for forming the conductor film by sputtering the polyimide sheet to separate out metal.

Furthermore, such a method for attaching the conductor film to the polyimide sheet is not particularly limited but a publicly-known method can be accordingly adopted. As such a method for attaching the conductor film to the polyimide sheet, an ordinary hydropress, a vacuum-type hydropress, an autoclave vacuum press, a continuous thermal laminator and the like can be cited. Moreover, when the conductor film is attached to the polyimide sheet as described above, it is preferable that the conductor film should be pressed while being heated to about 100 to 400° C. Furthermore, as to a press pressure, about 0.7 to 50 MPa is appropriate depending on a type of a pressing machine to be used.

Moreover, as the polyimide board as described above, a polyimide double-sided board including the conductor films laminated on both sides of the polyimide sheet may be used or a polyimide double-sided board including the conductor film laminated on one side of the polyimide sheet may be used.

As such a polyimide double-sided board, a commercially-available polyimide double-sided board may be used. Although not particularly limited, for example, ESPANEX (manufactured by Nippon Steel Chemical Co., Ltd.), NEOFLEX (manufactured by Mitsui Chemicals, Inc.), Upicell (manufactured by Ube Industries, Ltd.) and Pyralux (manufactured by DuPont Corp.) are cited. Among those described above, from the viewpoint of stability in dimensional changes, it is preferable to use ESPANEX (manufactured by Nippon Steel Chemical Co., Ltd.).

Moreover, as such a polyimide single-sided board, a commercially-available polyimide single-sided board may be used. Although not particularly limited, for example, ESPANEX (manufactured by Nippon Steel Chemical Co., Ltd.), NEOFLEX (manufactured by Mitsui Chemicals, Inc.), Upicell (manufactured by Ube Industries, Ltd.) and Pyralux (manufactured by DuPont Corp.) are cited. Among those described above, from the viewpoint of stability in dimensional changes, it is preferable to use ESPANEX (manufactured by Nippon Steel Chemical Co., Ltd.).

Moreover, in the steps as described above, a method for the etching is not particularly limited but a publicly-known method can be accordingly used. As a suitable method for the etching as described above, for example, the following method can be used. Specifically, a circuit pattern is formed by using an alkali development type dry film on a conductor film. Thereafter, the conductor film in a portion not protected by the dry film is removed by utilizing an etchant, and thus a circuit is formed. Subsequently, the dry film is removed.

Next, description will be given of the step of obtaining not less than two flexible wiring boards by attaching coverlay films to surfaces on which the conductor layers of the laminated bodies are laminated, respectively (the step of manufacturing flexible wiring boards).

Here, as the coverlay film, the same as that described above can be used. Moreover, in the step as described above, a method for attaching the coverlay films to the laminated bodies is not particularly limited but a publicly-known method can be accordingly used. As such a method for attaching the coverlay films to the laminated bodies, for example, the following method can be used. Specifically, the coverlay films are temporarily attached to the laminated bodies. Thereafter, the coverlay films are attached to the laminated bodies by use of a vacuum press machine. Moreover, when the coverlay films are attached to the laminated bodies as described above, it is preferable that the coverlay films should be attached to the laminated bodies while heating the films under conditions that the temperature is set to 20 to 250° C., time is set to 30 to 90 minutes and the pressure is set to 1 to 100 MPa.

Next, description will be given of the step of obtaining the hinge board by bonding the flexible wiring boards by use of a bonding material (the step of bonding the flexible wiring boards).

Here, as the bonding material, the same as that described above can be used. Moreover, in the step as described above, a method for bonding the flexible wiring boards by use of the bonding material is not particularly limited but a publicly-known method can be accordingly used. As such a method for bonding the flexible wiring boards by use of the bonding material, for example, the following method can be used. Specifically, the flexible wiring boards are attached to each other by use of the bonding material. Thereafter, a vacuum press machine is used to bond the flexible wiring boards by use of the bonding material. Moreover, when the flexible wiring boards are bonded by use of the bonding material as described above, it is preferable that the flexible wiring boards should be attached to the bonding material while heating those described above under conditions that the temperature is set to 20 to 250° C., time is set to 30 to 90 minutes and the pressure is set to 1 to 100 MPa.

In the method for producing a hinge board according to the present invention, at least one of the flexible wiring boards is required to be the flexible double-sided wiring board. If no flexible double-sided wiring board is used as the flexible wiring board, the thickness of the hinge board obtained is increased. Thus, sufficient high-density wiring cannot be achieved. Furthermore, in the hinge board of the present invention, from the viewpoint of achieving further reduction in thickness of the board and higher density wiring, it is preferable that at least two flexible double-sided wiring boards should be used as the flexible wiring boards.

Moreover, in the method for producing a hinge board according to the present invention, it is required that the flexible wiring boards are bonded to each other in the rigid part by use of the bonding material in such a manner that a space part is formed between the flexible wiring boards in the hinge bending part. If there is no space part formed between the flexible wiring boards in the hinge bending part, disconnection occurs in the conductor circuit when the hinge bending part is repeatedly bent.

As a method for forming the space part between the flexible wiring boards in the hinge bending part as described above, although not particularly limited, the following method, for example, can be used. Specifically, by use of a router processing machine or the like, an opening is provided in a portion to be the hinge bending part in the bonding material. Thereafter, the flexible wiring boards are bonded by use of the bonding material.

Furthermore, the method for producing a hinge board according to the present invention is a method for producing a hinge board further including a flexible single-sided wiring board, which includes a conductor layer only on one side of a polyimide sheet layer, on an uppermost surface and/or a lowermost surface of the hinge board. It is preferable that the method should further include the steps of: further bonding a polyimide single-sided board, in which a conductor film is laminated only on one side of a polyimide sheet, to the uppermost surface and/or the lowermost surface of the hinge board by use of a bonding material in such a manner that the conductor film of the polyimide single-sided board is positioned on the outer side; and forming a circuit on a surface of the polyimide single-sided board by etching the polyimide single-sided board, and, thereafter, obtaining the hinge board by attaching a coverlay film to the side on which the conductor layer of the polyimide single-sided board is laminated.

First, description will be given of the step of further bonding a polyimide single-sided board, in which a conductor film is laminated only on one side of a polyimide sheet, to the uppermost surface and/or the lowermost surface of the hinge board by use of a bonding material in such a manner that the conductor film of the polyimide single-sided board is positioned on the outer side (the step of bonding the flexible wiring boards and the like).

In the step as described above, as a method for bonding the polyimide single-sided board and the hinge board by use of the bonding material, a method similar to the above-described method for bonding the flexible wiring boards by use of the bonding material can be used.

Note that the step as described above (the step of bonding the flexible wiring boards and the like) can be performed in conjunction with the above-described step of bonding the flexible boards. As a method for performing the step of bonding the flexible wiring boards and the like in conjunction with the step of bonding the flexible boards, for example, the following method can be used. Specifically, the flexible wiring boards and the polyimide single-sided board are attached to each other by use of the bonding material in such a manner that the conductor film of the polyimide single-sided board is positioned on the outer side and the polyimide single-sided board is set to be the uppermost surface and/or the lowermost surface. Thereafter, by use of a vacuum press machine, the flexible wiring boards and the polyimide single-sided board are bonded by use of the bonding material.

Next, description will be given of the step of forming a circuit on a surface of the polyimide single-sided board by etching the polyimide single-sided board, and, thereafter, obtaining the hinge board by attaching a coverlay film to the side on which the conductor layer of the polyimide single-sided board is laminated (the step of surface-treating a hinge board having an unprocessed outer layer).

In the step as described above, as a method for the etching, the same method as that described above can be used. Moreover, as a method for attaching a coverlay film to the polyimide single-sided board, a method similar to the above-described method for attaching the coverlay film to the laminated body can be used.

Note that, in the step as described above, copper plating can be performed after through-holes are provided in the rigid part before the etching. By performing the above processing, arbitrary conduction can be realized between a plurality of circuits laminated. Moreover, as a method for providing the through-holes as described above, a publicly-known method can be accordingly used. Furthermore, as a method for the copper plating as described above, a publicly-known method can be accordingly used.

EXAMPLES

With reference to the drawings as needed, the present invention will be more concretely described below based on examples. However, the present invention is not limited to the following examples.

Example 1

(1) Step of Forming Circuit in Flexible Wiring Board

First, two polyimide double-sided boards [ESPANEX (Cu/PI/Cu: 12 μm/12 μm/12 μm); manufactured by Nippon Steel Chemical Co., Ltd.] are cut into a predetermined work size 250 mm×350 mm.

Next, by use of a heated roll laminator (ML-400W; manufactured by MCK Co., Ltd.), photosensitive dry films (AQ2070; manufactured by Asahikasei Co., Ltd.) are laminated on both surfaces of each of the polyimide double-sided boards at conditions of a heated roll temperature of 110° C., a pressure of 0.3 MPa and an application speed of 1 mm/min. Thereafter, by use of a high-pressure mercury lamp exposure device (THE-102ED; manufactured by Hitech Co., Ltd.), the both surfaces of the respective polyimide double-sided boards are exposed at a condition of an exposure of 70 mJ to have respective designated test patterns.

Next, the respective exposed polyimide double-sided boards are developed by use of a developer made of a 1% sodium carbonate solution ($Na_2CO_3$) at 30° C. Thereafter, the boards are etched by using a ferric chloride solution ($FeCl_3$) at 45° C. as an etchant. Subsequently, the dry films are removed by using a 3% sodium hydroxide solution (NaOH) at 40° C. as a release agent. Thus, two laminated bodies having conductor layers laminated are obtained. Specifically, in the conductor layers, circuits are formed in a predetermined pattern on both surfaces of a polyimide sheet layer.

(2) Step of Producing Flexible Wiring Board

Coverlay films (CVA0525KA; manufactured by Arisawa Mfg. Co., Ltd.) are temporarily pressure-bonded to both surfaces of the two laminated bodies obtained by the step of forming circuits in flexible wiring boards. Thereafter, the laminated bodies are heated to 160° C. while being pressurized at heat-up time of 3° C./min and a pressure of 3.4 MPa by use of a vacuum press machine (1570KN; manufactured by Kitagawa Seiki Co., Ltd.). Subsequently, the coverlay films are pressure-bonded to the laminated bodies, respectively, at a pressure of 3.4 MPa, at a processing temperature of 160° C. and for 60 minutes of processing time. Thereafter, the laminated bodies are cooled to room temperature within cooling time of 45 minutes. Thus, two flexible double-sided wiring boards are obtained.

(3) Step of Bonding Flexible Wiring Boards and the Like

First, three bonding materials (SAFD25; manufactured by Nikkan Industries Co., Ltd.) are cut into a predetermined work size 250 mm×350 mm. Thereafter, by use of a router processing machine, openings of 15 mm×22 mm are provided in predetermined 8 spots in the respective bonding materials.

Next, two polyimide single-sided boards [ESPANEX (Cu/PI: 12 μm/20 μm); manufactured by Nippon Steel Chemical Co., Ltd.] are cut into a predetermined work size 250 mm×350 mm.

Next, the two flexible double-sided wiring boards obtained by the step of producing flexible wiring boards, the two polyimide single-sided boards and the three bonding materials are laminated on each other while being positioned by utilizing previously provided reference holes for board lamination. Specifically, the above-described boards and members are laminated in the order of the polyimide single-sided board/the bonding material/the flexible double-sided wiring board/the bonding material/the flexible double-sided wiring board/the bonding material/the polyimide single-sided board in such a manner that conductor films of the polyimide single-sided boards are positioned on the outer side. Thereafter, the laminated body is heated to 160° C. while being pressurized at conditions of a heat-up time of 3° C./min and a pressure of 3.4 MPa by use of a vacuum press machine (1570KN; manufactured by Kitagawa Seiki Co., Ltd.) and then pressure-bonded at a pressure of 3.4 MPa, at a processing temperature of 160° C. and for 60 minutes of processing time. Subsequently, the laminated body is cooled to room temperature within cooling time of 45 minutes. Thus, a hinge board having an unprocessed surface (a hinge board having an unprocessed outer layer) is obtained.

Figure 1:
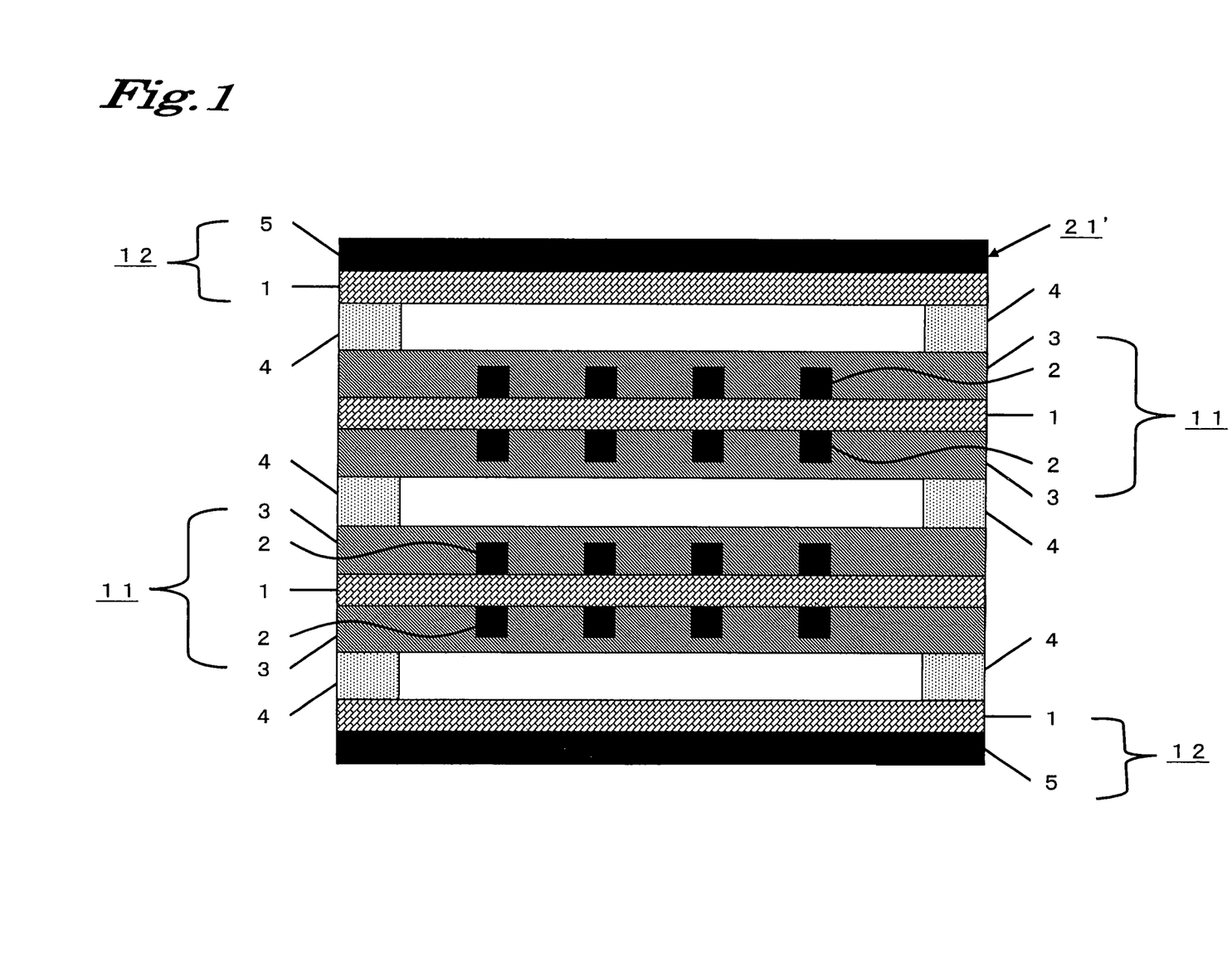
FIG. 1 is a schematic cross-sectional view showing a lamination structure of a hinge board having an unprocessed outer layer, which is obtained in an example.

FIG. 1 shows a lamination structure of the thus obtained hinge board having an unprocessed outer layer. In other words, the hinge board having an unprocessed outer layer shown in FIG. 1 includes two flexible double-sided wiring boards 11 including polyimide sheet layers 1, conductor layers 2 having circuits formed on both surfaces of the polyimide sheet layers 1 and coverlay film layers 3 covering the conductor layers 2. In the hinge board having an unprocessed outer layer shown in FIG. 1, the flexible double-sided wiring boards are bonded to each other in a rigid part by use of bonding materials 4 in such a manner that a space part is formed between the flexible double-sided wiring boards 11 in a hinge bending part. Furthermore, as shown in FIG. 1, the lamination structure is formed, in which polyimide single-sided boards 12, each of which has a conductor film 5 laminated only on one side of the polyimide sheet layer 1, are bonded to uppermost and lowermost surface sides of the hinge board 21' having an unprocessed outer layer in the rigid part by use of the bonding materials 4. Specifically, the polyimide single-sided boards 12 are bonded in such a manner that the conductor films 5 of the polyimide single-sided boards 12 are positioned on the outer sides and space parts are formed between the polyimide single-sided boards 12 and the flexible double-sided wiring boards 11 in the hinge bending part.

(4) Step of Surface-Treating Hinge Board Having Unprocessed Outer Layer

First, through-holes of ϕ0.25 mm are provided in predetermined spots of the hinge board having an unprocessed outer layer shown in FIG. 1. Thereafter, the hinge board is copper-plated to have a thickness of 0.01 to 0.015 mm by use of a pyrophosphate copper plating solution.

Next, by use of a heated roll laminator, dry films (AQ2070; manufactured by Asahikasei Co., Ltd.) are laminated on both surfaces of the conductor films 5 under the same conditions as those described above. Thereafter, exposure and development are performed to form a predetermined circuit pattern.

Next, coverlay films having openings provided are temporarily pressure-bonded to the both surfaces of the board having circuits formed in the same manner as that described above. Thereafter, a vacuum press machine is used to pressure-bond the films to the board. Thus, a target hinge board is obtained. The obtained hinge board has a thickness of 450 μm.

Figure 2:
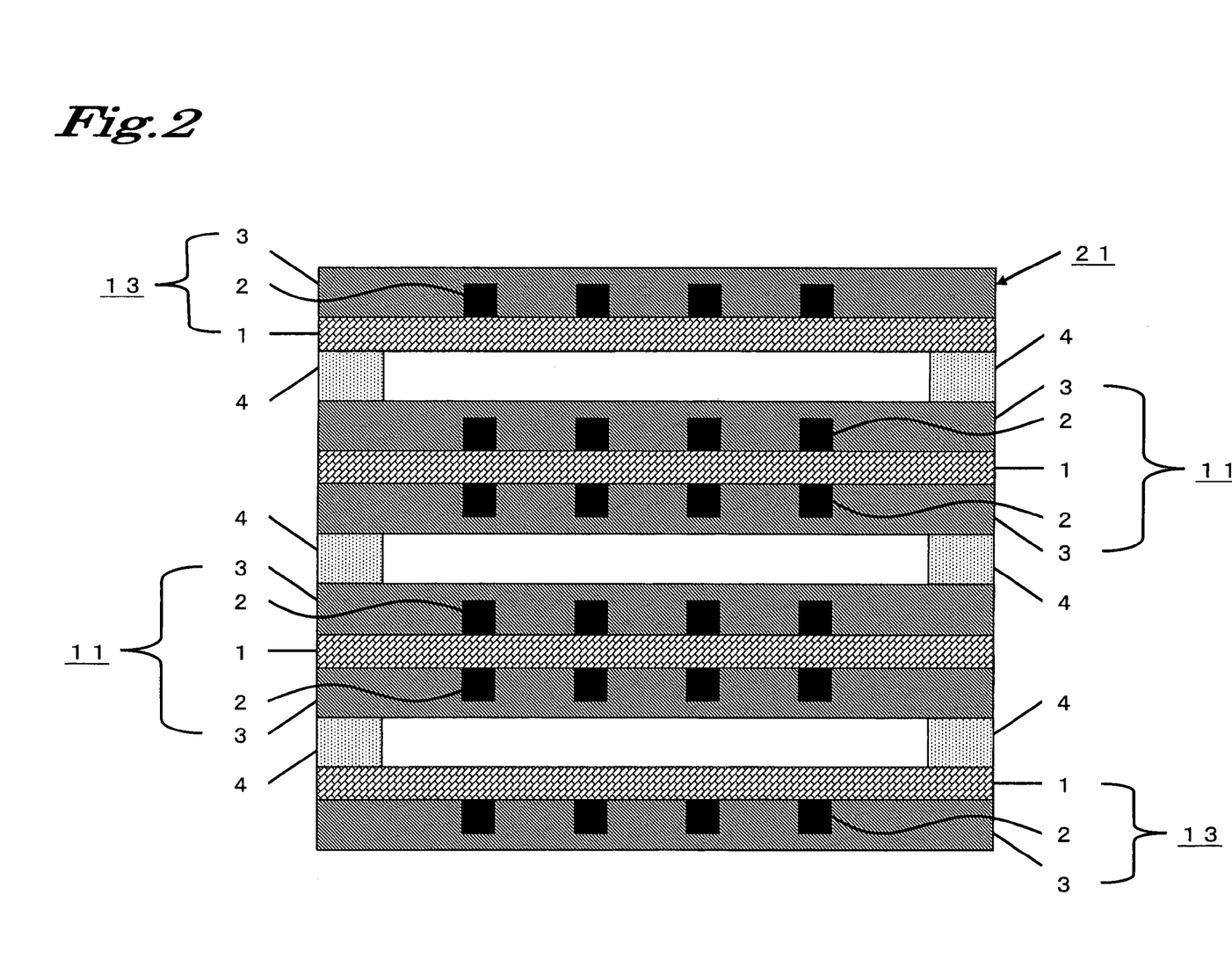
FIG. 2 is a schematic cross-sectional view showing a lamination structure of a hinge board of the present invention, which is obtained in an example.

FIG. 2 shows a lamination structure of the thus obtained hinge board of the present invention. Specifically, the hinge board of the present invention shown in FIG. 2 includes two flexible double-sided wiring boards 11 including polyimide sheet layers 1, conductor layers 2 having circuits formed on both surfaces of the polyimide sheet layers 1 and coverlay film layers 3 covering the conductor layers 2. In the hinge board of the present invention shown in FIG. 2, the flexible double-sided wiring boards are bonded to each other in a rigid part by use of bonding materials 4 in such a manner that a space part is formed between the flexible double-sided wiring boards 11 in a hinge bending part. Furthermore, as shown in FIG. 2, the lamination structure is formed, in which flexible single-sided wiring boards 13, each of which includes the polyimide sheet layer 1, the conductor layer 2 on one side of the polyimide sheet layer 1 and the coverlay film layer 3 covering the conductor layer 2, are bonded to uppermost and lowermost surface sides of the hinge board 21 in the rigid part by use of the bonding materials 4. Specifically, the flexible single-sided wiring boards 13 are bonded in such a manner that the conductor layers 2 of the flexible single-sided wiring boards 13 are positioned on the outer sides and space parts are formed between the flexible single-sided wiring boards 13 and the flexible double-sided wiring boards 11 in the hinge bending part.

In FIG. 2, the respective conductor layers 2 of the flexible wiring boards are positioned above and below the conductor layers adjacent thereto. Meanwhile, it is also possible to obtain a hinge board having better hinge flexibility by adjusting a width of each conductor pattern and an interval therebetween and shifting positions of the upper and lower conductors. The width of the conductor pattern in this case is 50 to 150 μm. It is preferable that the interval between the conductor patterns corresponding thereto should be set larger than the width of the conductor pattern. A preferable interval between the conductor patterns is within a range of 100 to 200 μm.

<Evaluation of Flexibility>

Flexibility of the hinge board obtained in the example is evaluated by use of the following method. Note that, as a test piece of the hinge board, the one produced as described above is used.

Figure 3:
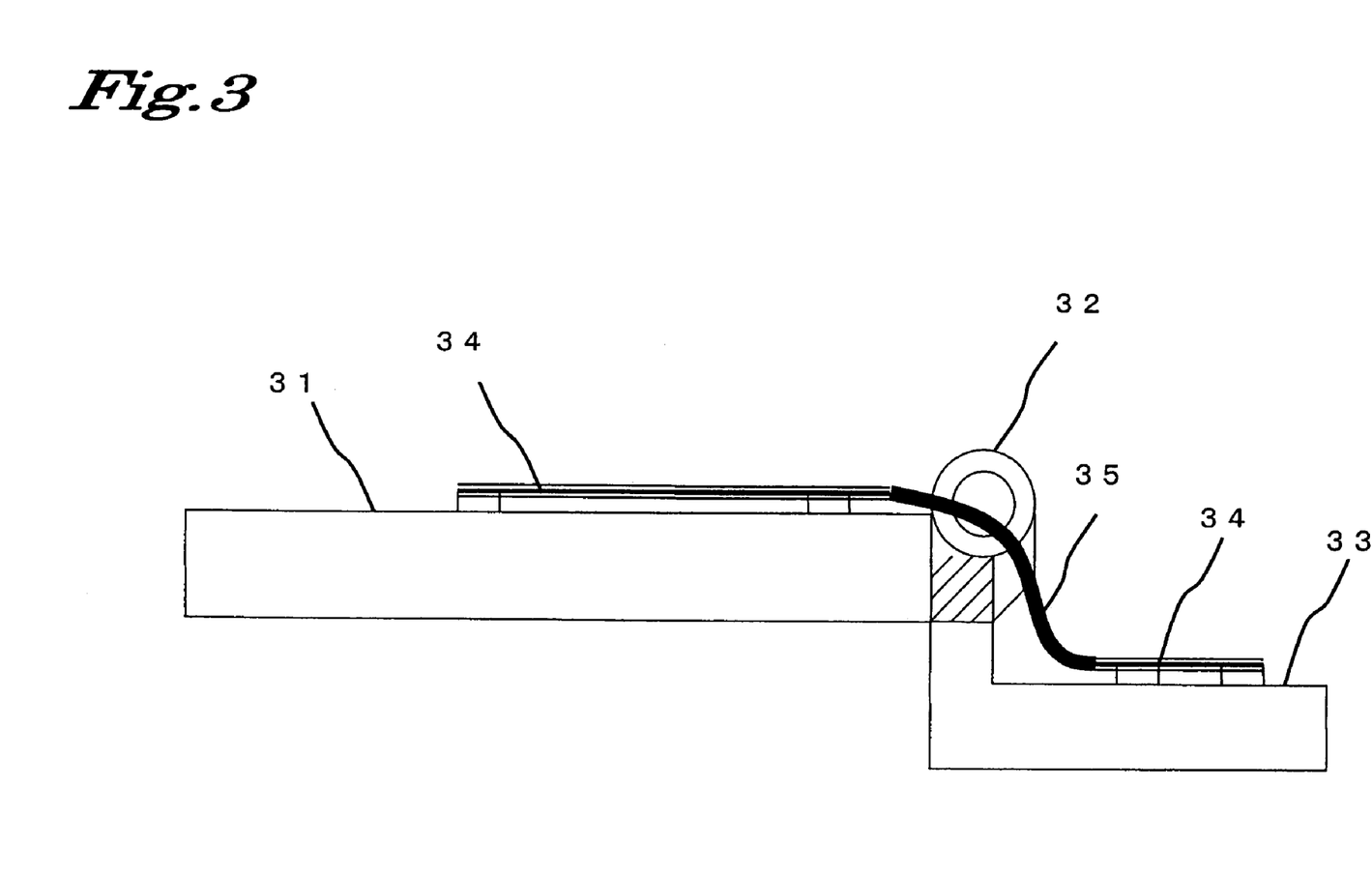
FIG. 3 is a cross-sectional view showing an outline of one state (open state) where a test piece of the hinge board is set on an apparatus used for testing hinge flexibility.
Figure 4:
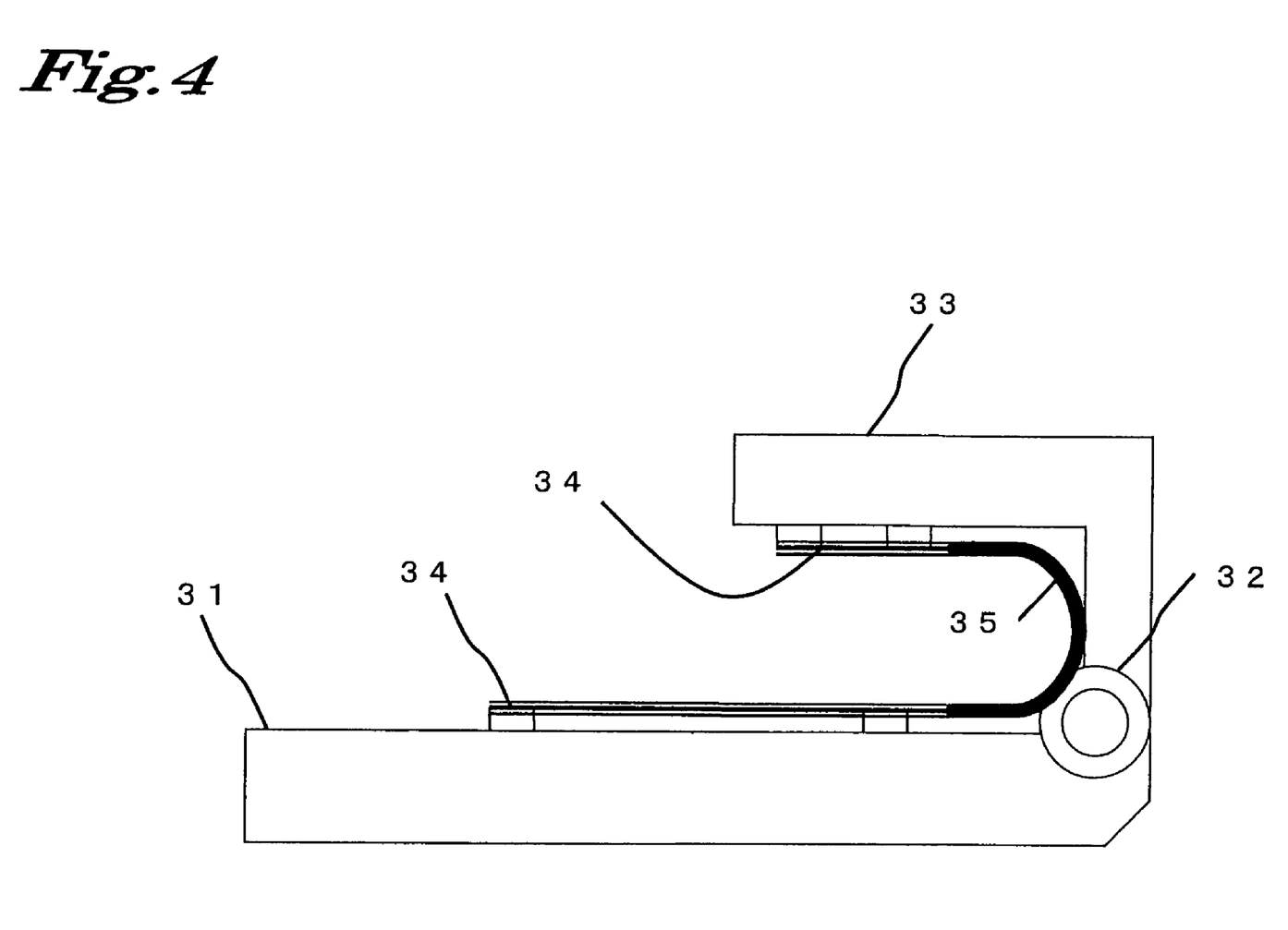
FIG. 4 is a cross-sectional view showing an outline of one state (closed state) where the test piece of the hinge board is set on the apparatus used for testing hinge flexibility.

FIG. 3 is a schematic cross-sectional view showing one state (open state) where the test piece of the hinge board is set on an apparatus used for testing hinge flexibility. FIG. 4 is a schematic cross-sectional view showing one state (closed state) where the test piece of the hinge board is set on the apparatus used for testing hinge flexibility. A fixing jig 31 shown in FIGS. 3 and 4 is a structure having a connection portion 32, and a moving jig 33 is a structure having the connection portion 32. The fixing jig 31 and the moving jig 33 are connected to each other in the connection portion 32 so as to allow the moving jig 33 to swing. Moreover, the test piece of the hinge board is a structure having a rigid part 34 and a hinge bending part 35 which are shown in FIGS. 3 and 4. The rigid part 34 is connected and fixed to the fixing jig 31 and the moving jig 33, respectively.

In evaluation of the hinge flexibility as described above, the following experiment is conducted. Specifically, by making the moving jig 32 swing from the state as shown in FIG. 3, through the state as shown in FIG. 4 and back to the state as shown in FIG. 3, the hinge bending part 34 of the hinge board is repeatedly bent. Accordingly, the number of bends before the conductor is broken to cut conduction is obtained.

A result obtained by conducting the evaluation of the flexibility of the hinge board obtained in the example by use of the method described above is "180,000 times".

Therefore, it is confirmed that the hinge board of the present invention can sufficiently prevent disconnection in the conductor circuit when the hinge bending part is repeatedly bent.

INDUSTRIAL APPLICABILITY

As described above, according to the present invention, it is possible to provide a hinge board and a method for producing the same, the hinge board being capable of realizing reduction in thickness thereof and high-density wiring as well as sufficiently preventing disconnection in a conductor circuit when a hinge bending part is repeatedly bent.

Therefore, the present invention is very useful as a technology related to a hinge board for an electronic device such as a folding portable telephone.

What is claimed is:

1. A hinge board which includes a hinge bending part and a rigid part, comprising:
    not less than two flexible wiring boards including a polyimide sheet layer, a conductor layer having a circuit formed on both sides or one side of the polyimide sheet layer, and a coverlay film layer covering the conductor layer,
    a flexible single-sided wiring board, which includes a polyimide sheet layer and a conductor layer having a circuit formed on one side of the polyimide sheet layer, formed on an uppermost surface and/or a lowermost surface of the hinge board, and
    a bonding material for bonding the flexible wiring boards,
    wherein the polyimide sheet layers have a thickness within a range of 5 to 50 µm,
    wherein at least one of the flexible wiring boards is a flexible double-sided wiring board including the conductor layers formed on both sides of the polyimide sheet layer,
    wherein the flexible wiring boards are bonded to each other in the rigid part by use of the bonding material in such a manner that a space part is formed between the flexible wiring boards in the hinge bending part, and
    wherein the conductor layer of the flexible single-sided wiring board is formed on an upper surface side of the flexible single-sided wiring board which is formed on the uppermost surface of the hinge board and/or on a lower surface side of the flexible single-sided wiring board which is formed on the lowermost surface of the hinge board.

2. The hinge board according to claim 1, wherein at least two of the flexible wiring boards are the flexible double-sided wiring boards.

3. The hinge board according to claim 1, wherein the polyimide sheet layer is formed of a plurality of polyimide-based resin layers.

4. A method for producing the hinge board according to claim 1, comprising the steps of:
    etching not less than two polyimide boards, each of which is formed by laminating conductor films on both sides or one side of a polyimide sheet, and obtaining not less than two laminated bodies in each of which conductor layers are laminated, the conductor layers having circuits formed on both sides or one side of a polyimide sheet layer;
    obtaining not less than two flexible wiring boards by attaching coverlay films to surfaces on which the conductor layers of the laminated bodies are laminated, respectively; and
    obtaining the hinge board by bonding the flexible wiring boards by use of a bonding material,
    wherein at least one of the flexible wiring boards is a flexible double-sided wiring board including the conductor layers on both sides of the polyimide sheet layer,
    wherein the flexible wiring boards are bonded to each other in the rigid part by use of the bonding material in such a manner that a space part is formed between the flexible wiring boards in the hinge bending part, and
    wherein the polyimide sheet layer has a thickness within a range of 5 to 50 µm.

5. The method for producing a hinge board, according to claim 4, wherein at least two of the flexible wiring boards are the flexible double-sided wiring boards.

6. The method for producing a hinge board, according to claim 4, wherein the hinge board further includes a flexible single-sided wiring board, which includes a conductor layer only on one side of a polyimide sheet layer, on an uppermost surface and/or a lowermost surface of the hinge board, and, the method further comprises the steps of:
    further bonding a polyimide single-sided board, in which a conductor film is laminated only on one side of a polyimide sheet, to the uppermost surface and/or the lowermost surface of the hinge board by use of a bonding material in such a manner that the conductor film of the polyimide single-sided board is positioned on the outer side; and
    forming a circuit on a surface of the polyimide single-sided board by etching the polyimide single-sided board, and, thereafter, obtaining the hinge board by attaching a coverlay film to the side on which the conductor layer of the polyimide single-sided board is laminated.

7. The method for producing a hinge board, according to claim 4, wherein the polyimide sheet layer is formed of a plurality of polyimide-based resin layers.

* * * * *